July 16, 1968 G. D. CLAPP ET AL 3,393,377

RESONANT REED OSCILLATOR

Filed Feb. 28, 1967

INVENTORS.
GARY D. CLAPP,
FRED MACRENO, JR.
DONALD W. McMILLAN
H. H. Losche
Attorney United States Patent Office 3,393,377

Patented July 16, 1968

3,393,377

RESONANT REED OSCILLATOR

Gary D. Clapp and Fred Macreno, Jr., Indianapolis, and Donald W. McMillan, Fort Wayne, Ind., assignors to the United States of America as represented by the Secretary of the Navy Filed Feb. 28, 1967, Ser. No. 619,897
7 Claims. (Cl. 331—116)

ABSTRACT OF THE DISCLOSURE

A resonant reed oscillator having an output clipper driver stage coupled to a branch circuit, one branch circuit being a feedback circuit with a high gain clipping amplifier network and a filter therein and the other branch circuit having an output filter and an amplifier therein to achieve stability over a wide temperature range, the stability being primarily achieved by clipping and filtering the waveform in the high gain amplifier feedback circuit to a constant amplitude.

The invention described herein may be manufactured and used by or for the Government of the United States of America for governmental purposes without the payment of any royalties thereon or therefor.

*Background of the invention*

This invention is in the field of resonant reed or tuning fork oscillators.

Known resonant reed or tuning fork oscillators attempt to stabilize the oscillations by compensating circuits to correct for supply driving voltage variations or to amplitude limit the feedback voltage to the reed or tuning fork voltage frequency. These known oscillators create problems in setting the correct modulation percentage of the command transmitter and in getting started in oscillation.

*Summary of the invention*

In the present invention the output of a resonant reed oscillator is applied through a clipping circuit in a high gain amplifier, the output of which is driven from cutoff to saturation, to produce constant amplitude oscillations in feedback to the reed encoder. These constant amplitude oscillations are filtered to remove high order harmonics from the signal fed back to the encoder. The output of the resonant reed oscillator is also coupled through an output filter and amplifier for use of the oscillations in other circuitry to where frequency stability and amplitude stability over a wide temperature range is required and accomplished herein. It is a general object of this invention to provide a resonant reed oscillator with a constant amplitude feedback to the reed encoder to produce constant frequency and stable amplitude oscillations over a wide temperature range.

*Brief description of the drawing*

These and other objects and the attendant advantages, features, and uses will become more apparent to those skilled in the art as the description proceeds when taken in consideration of the accompanying drawing, in which.

*Description of the preferred embodiment*

Figure 1:
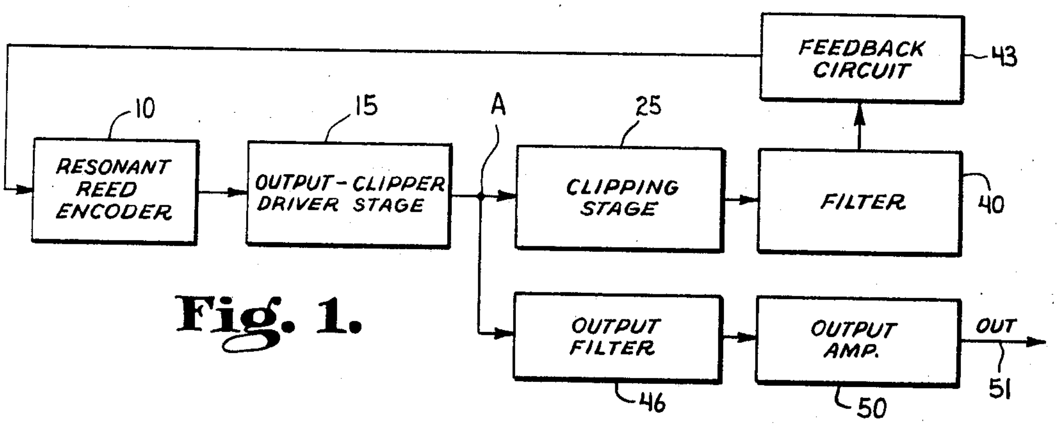
FIGURE 1 is a block diagram of the circuit of the invention.

Referring more particularly to FIGURE 1 there is shown a block diagram of the invention in which a resonant reed encoder 10 provides resonant oscillations to an output clipper driver stage 15 to produce the desired oscillations on the output thereof in an output branch circuit. The clipper driver circuit 15 is a constant gain amplifier. One branch circuit of the output clipper driver 15 is applied to a clipping stage 25, the output of which is filtered in 40 and fed back through a feedback circuit 43 to the resonant reed encoder 10. The feedback to the resonant reed encoder 10 provides constant amplitude frequency signals which stabilize the amplitude of the frequency signals on the output of the clipper driver stage 15. The second output from the clipper driver stage 15 is through an output filter 46 and an output amplifier 50 providing the desired output oscillations on an output conductor 51. A better understanding of the means in the circuit to stabilize the output oscillations in amplitude and over a wide temperature range is more particularly described with reference to FIGURE 2.

Figure 2:
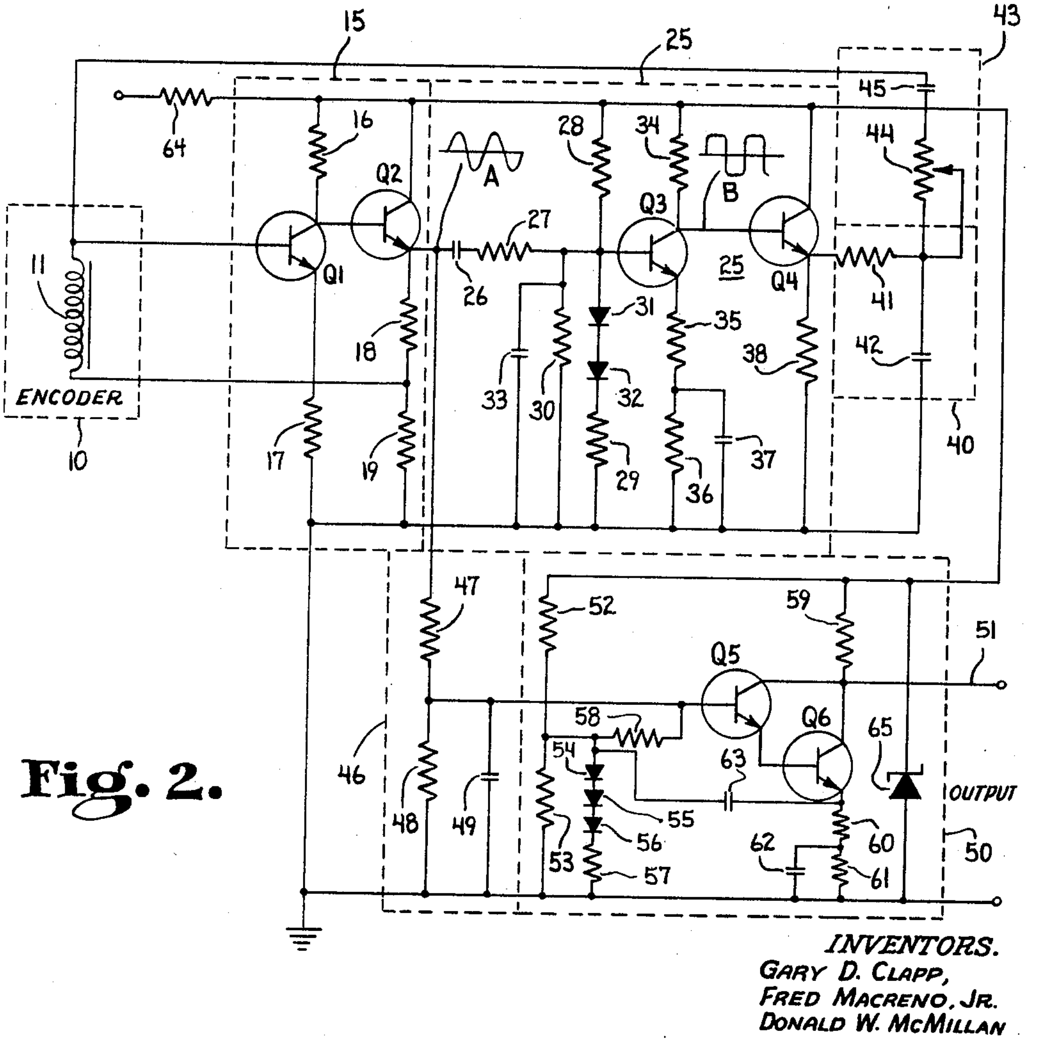
FIGURE 2 is a circuit schematic of the block circuit of FIGURE 1.

Referring more particularly to FIGURE 2 there is shown a circuit schematic diagram of the circuit in FIGURE 1 with the several blocks of FIGURE 1 shown in dotted lines and identified by like reference characters. The encoder 10 consists of a coil 11 to drive a reed of magnetic material to provide a resonant frequency, as determined by the reed for the coil 11. The resonant reed encoder 10 is coupled to the output clipper driver stage 15, consisting of transistors Q1 and Q2, in a circuit in which one end of the encoder coil 11 is coupled directly to the base of transistor Q1. Q1 is an NPN type transistor with the collector coupled through a load resistor 16 to a positive voltage source and with the emitter coupled through a load resistor 17 to the opposite pole of the voltage source, herein shown as being a fixed or ground potential. The collector of transistor Q1 is directly coupled to the base of transistor Q2 which is of the NPN type having its collector coupled directly to the positive voltage source and its emitter coupled in series through resistors 18 and 19 to ground. The other end of the encoder coil 11 is coupled to the junction point of resistors 18 and 19 providing a negative feedback to the clipper driver circuit 15. The output of the clipper driver stage 15 is taken from the emitter of transistor Q2, designated as terminal A, herein showing the sine waveform developed at this terminal.

Terminal A connects a branch circuit, one branch of which is coupled to the clipping stage 25 through a coupling capacitor 26 and a resistor 27 to the base of a clipping NPN transistor Q3. Resistor 27 is used to mask the effects of the input impedance change of the clipper stage as Q3 is driven from cutoff to saturation. The base of transistor Q3 is biased between the positive voltage source and ground by the resistors 28, 29, and 30 and the diodes 31 and 32. The resistors 28, 29, 30, and diodes 31 and 32 form a temperature compensated base bias network which compensates for the variations of the voltage drop in the base-emitter diode of Q3. The base of transistor Q3 is also coupled to one plate of a capacitor 33, the opposite plate of which is grounded, this capacitor serving to limit the high frequency response of the oscillator and thus force operation at the resonant frequency of the encoder. The collector of transistor Q3 is coupled to the positive voltage supply through a load resistor 34 and the emitter thereof is coupled to ground through the series resistors 35 and 36, the resistor 36 being paralleled by a capacitor 37. The resistor 35 increases the alternating current input impedance of the clipping stage and reduces the variation of the stage gain to a certain extent. The capacitor 37 may be of different values to be compatible with different established frequencies, as will later be set forth in tables of values. The collector output of the clipping transistor Q3 is by way of a conductor showing the waveform B thereon being a substantially square wave in synchronism with the waveform A and this collector output is coupled directly to the base of the transistor cathode follower Q4. The collector of transistor Q4 is directly coupled to the positive voltage source while the emitter thereof is coupled through a resistor 38 to ground. The output of this clipping stage 25 is taken from the emitter of the NPN emitter follower transistor Q4.

The emitter output of Q4 is coupled to the filter 40 consisting of a resistor 41 and a capacitor 42. The filter 40 output is coupled to the feedback circuit 43 consisting of a potentiometer 44 and a capactior 45 having an output coupled to the base of transistor Q1, being likewise coupled to the upper lead of encoder coil 11. The filter 40 removes the higher harmonics from the output waveform of the clipping stage 25. Potentiometer 44 is adjustable to control the constant amplitude output of the clipping stage 25 to the input of the output clipper driver stage 15. Potentiometer 44 thus adjusts the amplitude of the feedback waveform to control the amplitude of the oscillator output at 51.

The second branch circuit output from terminal A is coupled through the output filter 46 to the output amplifier 50. The output filter 46 consists of resistors 47 and 48 coupled in series between the terminal A and ground with the resistor 48 being paralleled by the capacitor 49. Flter 46 removes the harmonics from the output waveform on conductor 51. The junction of resistors 47 and 48 and capacitor 49 provides the output to the output amplifier 50 which is coupled directly to the base electrode of the NPN transistor Q5 which is coupled in complement to a transistor Q6 having their collectors coupled in common and the emitter of transistor Q5 coupled directly to the base of transistor Q6. The base of transistor Q5 is biased through a temperature compensating network consisting of resistors 52 and 53 in series between the positive voltage source and ground, the junction of these resistors being coupled through a series of diodes 54, 55, and 56, and a resistor 57 to ground. The junction point of the resistors 52, 53 and the diode series is coupled to the base of transistor Q5 through a resistor 58 providing a temperature compensated high impedance input to transistor Q5. The common collector load of transistors Q5 and Q6 is through a resistor 59 and the emitter is coupled to ground through series resistors 60 and 61 with the resistor 61 being in parallel with a capacitor 62. The emitter of transistor Q6 is likewise capacitor coupled in a feedback relation to the terminal junction of resistors 52, 53, and 58 through a capacitor 63. The oscillator output 51 is taken from the common collector coupling of the transistor amplifier, consisting of transistors Q5 and Q6, for use in other circuitry, or the like, as desired.

A resistor 64 in the voltage supply circuit and a Zener diode 65 coupled across the voltage supply and ground form a Zener decoupling circuit for voltage regulating supply voltage to the several circuits.

For convenience in specifically describing one operating example, the following Table I lists the elements in FIGURE 2 and their values. Resistances in ohms are represented by the Symbol Ω and K is used as a factor of 1000Ω. Table II below establishes three examples of capacitor values for the capacitor 37 to obtain several desirable frequencies, and Table III hereinbelow sets forth three values of the capacitor 49 for corresponding frequencies established by the capacitor 37. While these examples of working embodiments are provided herein, it is to be understood that they are in no way to limit the invention to these values since other values may be utilized for the various elements to accomplish similar results at other desired frequencies.

TABLE I

*Resistors*

| | |
|---|---|
| 16, 29 | 5.11K |
| 17, 38 | 1K |
| 18, 19 | 330Ω |
| 27 | 1.2K |

*Resistors*—Continued

| | |
|---|---|
| 28 | 7.15K |
| 30, 34 | 8.2K |
| 35 | 82Ω |
| 36 | 6.8K |
| 41, 47, 48 | 10K |
| 44 | 100K |
| 52 | 56.7K |
| 53 | 63.4K |
| 57 | 15K |
| 58 | 6.2K |
| 59 | 4.99K |
| 60 | 700Ω |
| 61 | 1.3K |
| 64 | 121Ω |

*Capacitors*

| | uf |
|---|---|
| 26, 45 | 10 |
| 33 | .005 |
| 42 | .002 |
| 62, 63 | 100 |

*Transistors*

| | |
|---|---|
| Q1–Q5 | 2N930 |
| Q6 | 2N2102 |

*Diodes*

| | |
|---|---|
| All | 1N662 |

*Zener*

1N3581A

TABLE II

*Capacitor 37*

| 8μf., c.p.s.: | 10μf., c.p.s.: | 12μf., c.p.s.: |
|---|---|---|
| 634.5 | 510.5 | 399.0 |
| 600.9 | 483.5 | 368.5 |
| 569.1 | 457.9 | 349.0 |
| 539.0 | 433.7 | 330.5 |
| | 410.8 | 313.0 |

TABLE III

*Capacitor 49*

| .022μf., c.p.s.: | .033μf., c.p.s.: | .047μf., c.p.s.: |
|---|---|---|
| 634.5 | 510.5 | 389.0 |
| 600.9 | 483.5 | 368.5 |
| 569.1 | 457.9 | 349.0 |
| 539.0 | 433.7 | 330.5 |
| | 410.8 | 313.0 |

*Operation*

In the operation of the device let it be assumed that the supply voltage is applied which causes the oscillator to oscillate at a resonant frequency determined by the magnetic reed in relation to the coil 11, operating in an equivalent manner to an LC parallel resonant circuit. At the resonant frequency of the reed in the encoder 10 the power drawn by the coil 11 is a minimum and the equivalent impedance of the encoder, as used in two terminal devices, is at the maximum. This frequency is applied to the output clipper driver stage 15 to produce the waveform A in accordance with the amplification factor of the Q1, Q2 stages. The waveform A is applied to the clipping stage 25, transistor Q3 being a very high gain amplifier, the output of which is driven from cutoff to saturation by the input on its base. Any temperature variations causing a voltage variation between base and emitter of transistor Q3 will be compensated by the temperature compensating bias network 28 through 32. The output of the high gain amplifier transistor Q3 produces the clipped square waves B which are coupled through the cathode follower Q4 through the filter circuit 40 and feedback circuit 43 to the base of transistor Q1 providing a feedback of constant amplitude waveform at the frequency of the encoder 10 to stabilize the amplitude of the waveform A on the output of the clipper driver stage 15. This amplitude will remain constant for any amplitude setting of the potentiometer 44. The constant amplitude oscillations A from the clipper driver stage 15 is filtered in 46 and amplified in the output amplifier 50 to produce the constant amplitude and constant frequency oscillations on the output 51. Any ambient temperature variations tending to cause a voltage change between the base and emitter of transistors Q5 and Q6 will be compensated in the temperature compensating network consisting of elements 52 through 58. The circuit of FIGURE 2 is a rapid start circuit and, for the values given in the tables above, is frequency stabilized within one-tenth of one percent over a temperature range of −30 to +65 centigrade.

While many modifications and changes may be made by changing element values or by replacing certain elements with equivalent elements and components to obtain the desired results of stable oscillations over a temperature range, it is to be understood that we desire to be limited in the spirit of our invention only by the scope of the appended claims.

We claim:

1. A resonant reed oscillator circuit comprising:

a resonant reed encoder having an associated coil;

an output clipper driver circuit having an input and an output with said coil of said encoder coupled to said input;

an output filter and an output amplifier coupled in series to the output of said driver circuit;

a clipper-amplifier circuit coupled to said driver circuit output, said clipper-amplifier being of high gain to amplify oscillations of said driver circuit output and said clipper-amplifier being operative to clip the amplitudes of the oscillations at a constant level; and a second filter coupled to the output of said clipper-amplifier through a feedback network to said encoder coil to feedback constant amplitude oscillations to said output clipper driver circuit to stabilize said output amplifier oscillations in amplitude over a wide temperature range.

2. A resonant reed oscillator as set forth in claim 1 wherein said feedback network includes a potentiometer on the output of said second filter and a coupling capacitor coupling said potentiometer output to said encoder coil, said potentiometer being adjustable to control the amplitude of oscillations fed back to said clipper driver circuit.

3. A resonant reed oscillator as set forth in claim 2 wherein said output clipper driver circuit, said clipper-amplifier circuit, and said output amplifier are semiconductor circuits.

4. A resonant reed oscillator as set forth in claim 3 wherein said high gain clipper-amplifier is a transistor having emitter and collector load resistors with the output taken from said collector and with the input applied to the base to drive said transistor to cutoff and to saturation by oscillations on said base.

5. A resonant reed oscillator as set forth in claim 4 wherein said output clipper driver circuit includes a first transistor having collector and emitter load resistors with the collector output thereof coupled directly to the base of a second transistor constituting the driver of said clipper driver circuit, with the output taken from the emitter of said second driver transistor and with the base of said first transistor coupled directly to said encoder coil to cause said clipper driver transistor to amplify the decoder frequency applied to the base of said first transistor.

6. A resonant reed oscillator as set forth in claim 5 wherein said clipper-amplifier and said output amplifier are each transistor circuits having the base electrode constituting the input, each input having a series of diodes in series and in parallel with resistive elements to a fixed potential to compensate for ambient temperature changes.

7. A resonant reed oscillator as set forth in claim 6 wherein said clipper-amplifier coupling to said second filter is through an emitter follower to provide a low impedance output through said filter, potentiometer, and capacitor to said encoder.

References Cited

UNITED STATES PATENTS 2,300,271 10/1942 Whitaker ---------- 331—156

OTHER REFERENCES

Electronic Design, "Resonant Reed Stabilizes Audio Oscillator Frequency," Nov. 29, 1965; pp. 76–77.

ROY LAKE, *Primary Examiner.*

S. H. GRIMM, *Assistant Examiner.*